USO05672543A

United States Patent [19]
Chang et al.

[11] Patent Number: 5,672,543
[45] Date of Patent: Sep. 30, 1997

[54] VOLCANO DEFECT-FREE TUNGSTEN PLUG

[75] Inventors: Chaur Rong Chang; Po-Tao Chu; Tzu-Min Peng; Kuang-Hui Chang, all of Hsin-chu, Taiwan

[73] Assignee: Taiwan Semiconductor Manufacturing Company, Ltd., Hsinchu, Taiwan

[21] Appl. No.: 639,677

[22] Filed: Apr. 29, 1996

[51] Int. Cl.⁶ .................................................. H01L 21/28
[52] U.S. Cl. ...................... 437/192; 437/190; 437/200
[58] Field of Search .................................. 437/190, 192, 437/200, 246

[56] References Cited

U.S. PATENT DOCUMENTS

| | | | |
|---|---|---|---|
| 5,183,782 | 2/1993 | Onishi et al. | 437/192 |
| 5,332,691 | 7/1994 | Kinoshita et al. | 437/192 |
| 5,397,742 | 3/1995 | Kim | 437/190 |
| 5,489,552 | 2/1996 | Merchant et al. | 437/192 |
| 5,552,339 | 9/1996 | Hsieh | 437/190 |

*Primary Examiner*—John Niebling
*Assistant Examiner*—Thomas G. Bilodeau
*Attorney, Agent, or Firm*—George O. Saile; Rosemary L. S. Pike

[57] ABSTRACT

A new method of metallization using a tungsten plug is described. Semiconductor device structures are provided in and on a semiconductor substrate. An insulating layer covers the semiconductor device structures wherein a contact opening is made through the insulating layer to the semiconductor substrate. A barrier layer is deposited conformally over the surface of the insulating layer and within the contact opening. A stress buffer layer is deposited overlying the barrier layer wherein the stress buffer layer prevents volcano defects. A tungsten plug is formed within the contact opening to complete the formation of the tungsten plug metallization without volcano defects in the fabrication of an integrated circuit device.

10 Claims, 5 Drawing Sheets

VOLCANO DEFECT-FREE TUNGSTEN PLUG

BACKGROUND OF THE INVENTION (1) Field of the Invention

The invention relates to a method of metallization in the fabrication of integrated circuits, and more particularly, to a method of tungsten metallization preventing peeling of the tungsten or underlying glue layer called the volcano defect in the manufacture of integrated circuits.

(2) Description of the Prior Art

Tungsten-plug metallization is well-known in the art. A conventional tungsten plug process of the prior art is illustrated in FIG. 1. Referring now to FIG. 1, there is shown semiconductor substrate 10. A contact hole has been opened through interlevel dielectric layer 20 to source/drain region 14. A titanium glue layer 24 and titanium nitride barrier layer 26 have been deposited over the surface of the substrate and within the contact hole. A layer of tungsten 28 is deposited which will form a plug within the contact hole. The titanium nitride (TIN) barrier layer 26 can prevent the penetration of $WF_6$ gas during the tungsten deposition step. However, the nucleation step of the tungsten chemical vapor deposition (CVD) process has a $WF_6$ gas rich chamber condition. If the $WF_6$ gas penetrates through the TiN layer, the $WF_6$ gas can react with the titanium molecules to form $TiF_3$ gas. The continuous out-gassing of $TiF_3$ through the deposited tungsten film will create a mountain-shaped opening 30 on top of the tungsten film. This is the so-called volcano defect.

If the deposition of the tungsten film is conducted right after the TiN deposition, the volcano defects are more likely to be observed. Voids or cracks 32, due to compressive stress are formed in the TiN film, especially near the sharp corner of the contact hole. The $WF_6$ can easily pass through these voids to react with the underlying titanium. The titanium might also be exposed to the $WF_6$ due to poor step coverage of the TiN film.

In order to compensate for poor step coverage of the TiN film and the strength of the TiN structure near the sharp corner of the contact hole, a Rapid Thermal Annealing (RTA) treatment is inserted between TiN deposition and tungsten deposition. Because of the instrument hardware configuration limitation, the RTA treatment throughput is too low compared with the other processes and the equipment itself is hard to maintain. The RTA treatment becomes a bottleneck for the whole process flow.

Volcano defects have been observed frequently on the scribe lines, seal rings, and bonding pads rather than on the small contact areas. FIG. 2 illustrates a top view of bonding pads 62. Volcano defects 30 can be seen in the area of the bonding pads. The most reasonable explanation for this phenomenon is the stress-induced deformation of the TIN layer during the tungsten film growing step. As we know, tungsten film exhibits strong tensile stress. During the tungsten CVD process, the stress induced deformations are much more severe in the local areas with lengthy steep corners such as the bonding pads, seal rings, and scribe lines. Within these areas, more voids are generated and thus, more volcano defects are formed.

In order to reduce the possibilities for volcano defects, it is necessary to reduce the stress differences between the tungsten film and the underlying Ti/TiN barrier layer. Volcano defects are more likely to be observed when the stress differences between the tungsten film and the barrier layer is high.

U.S. Pat. No. 5,397,742 to Kim teaches the formation by Rapid Thermal Annealing (RTA) of a titanium silicide layer on top of the TiN layer. U.S. patent application Ser. No. 08/297,501 (TS93-039) to S. H. Hsieh filed on Aug. 29, 1994, now U.S. Pat. No. 5,552,339 teaches forming a furnace amorphous silicon layer over the TiN layer. U.S. Pat. No. 5,332,691 to Kinoshita et al teaches forming a highly amorphous silicon-containing tungsten layer over the TiN layer.

SUMMARY OF THE INVENTION

A principal object of the present invention is to provide an effective and very manufacturable method of tungsten plug metallization which prevents the volcano defect.

Another object of the invention is to provide a method of tungsten plug metallization which reduces stress differences between the tungsten film and the underlying barrier layer.

Yet another object is to provide a method of tungsten plug metallization which utilizes a stress buffer layer on top of the TiN barrier layer to prevent the volcano defect.

A still further object of the invention is to provide a method of tungsten plug metallization which reduces stress differences between the tungsten film and the underlying barrier layer by utilizing a stress buffer layer on top of the barrier layer.

In accordance with the objects of this invention a new method of metallization using a tungsten plug is achieved. Semiconductor device structures are provided in and on a semiconductor substrate. An insulating layer covers the semiconductor device structures wherein a contact opening is made through the insulating layer to the semiconductor substrate. A barrier layer is deposited conformally over the surface of the insulating layer and within the contact opening. A stress buffer layer is deposited overlying the barrier layer wherein the stress buffer layer prevents volcano defects. A tungsten plug is formed within the contact opening to complete the formation of the tungsten plug metallization without volcano defects in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
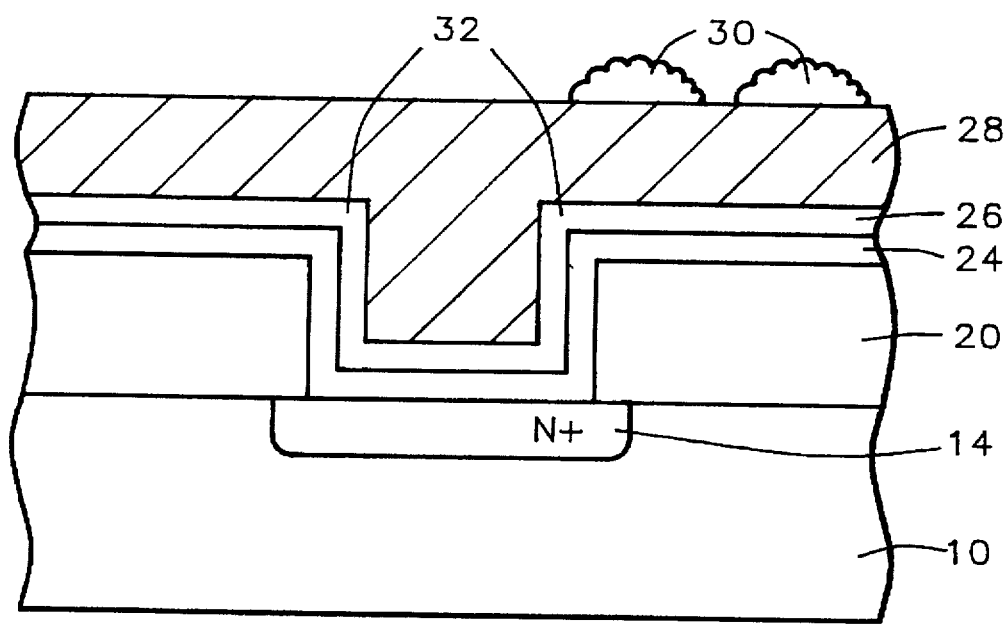
FIG. 1 schematically illustrates in cross-sectional representation a conventional tungsten plug process of the prior art.
Figure 2:
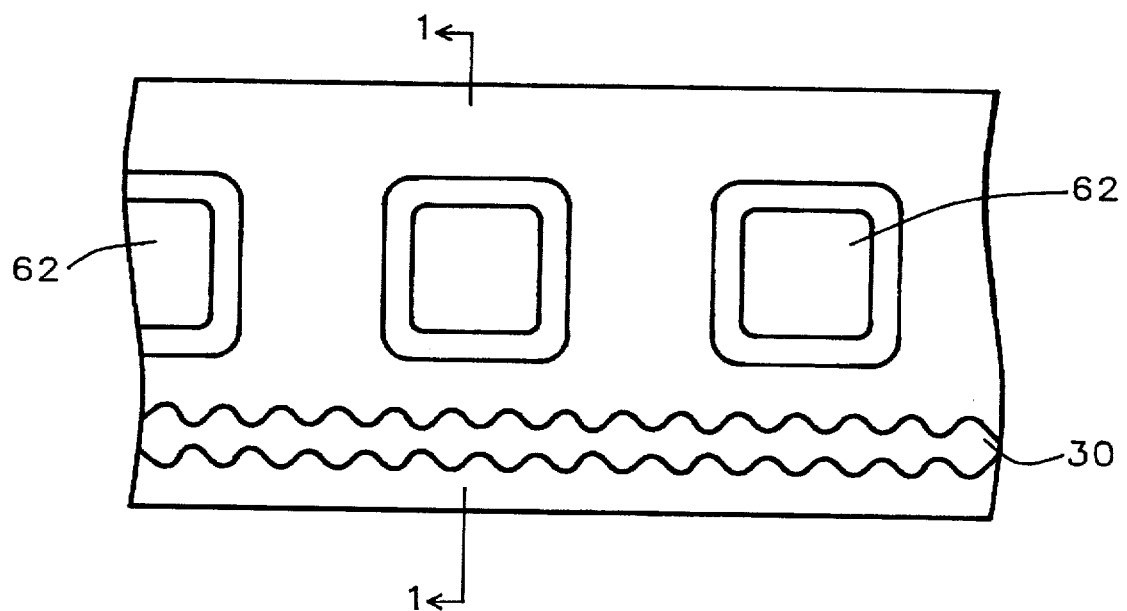
FIG. 2 schematically illustrates a top view of the bonding pad area of a prior art integrated circuit device including volcano defects.
Figure 3:
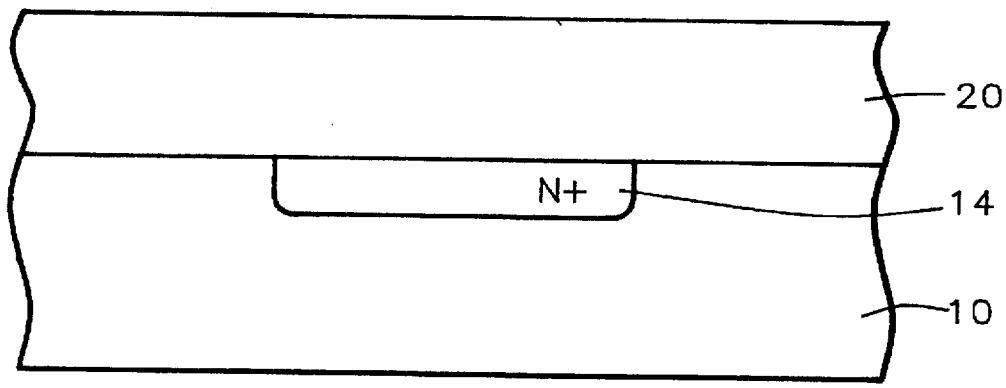
FIGS. 3 through 8 schematically illustrate in cross-sectional representation a preferred embodiment of the present invention.

Referring now more particularly to FIG. 3, there is illustrated a portion of a partially completed integrated circuit. There is shown a semiconductor substrate 10, preferably composed of monocrystalline silicon. Source/drain regions 14 are formed as is understood in the art either before or after formation of gate electrodes (not shown).

Figure 4:
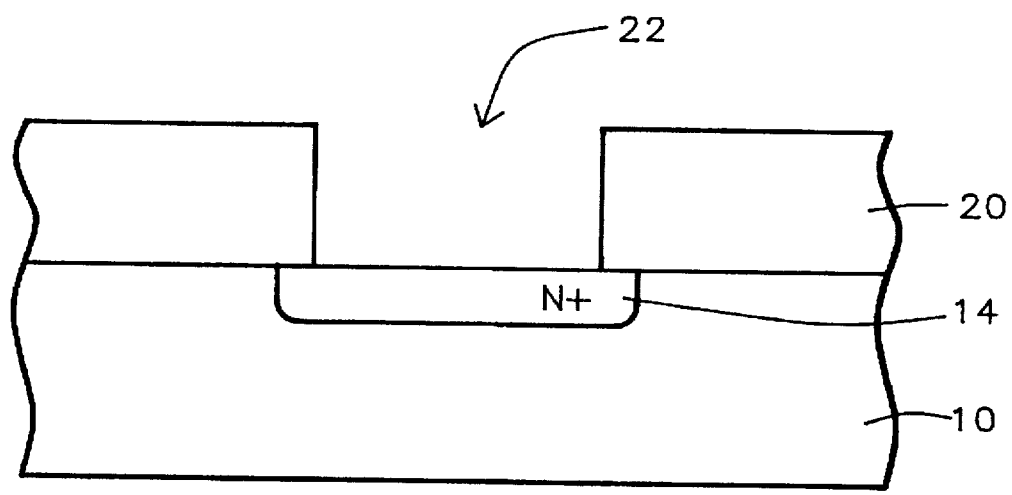

An interlevel dielectric layer 20, composed of borophosphosilicate glass (BPSG), borosilicate glass (BSG), or phosphosilicate glass (PSG), or the like, is deposited over the surface of the semiconductor device structures to a thickness of between about 5000 to 15,000 Angstroms. A contact hole 22 is opened through the insulating layer to the source/drain region 14 within the semiconductor substrate, as shown in FIG. 4.

Figure 5:
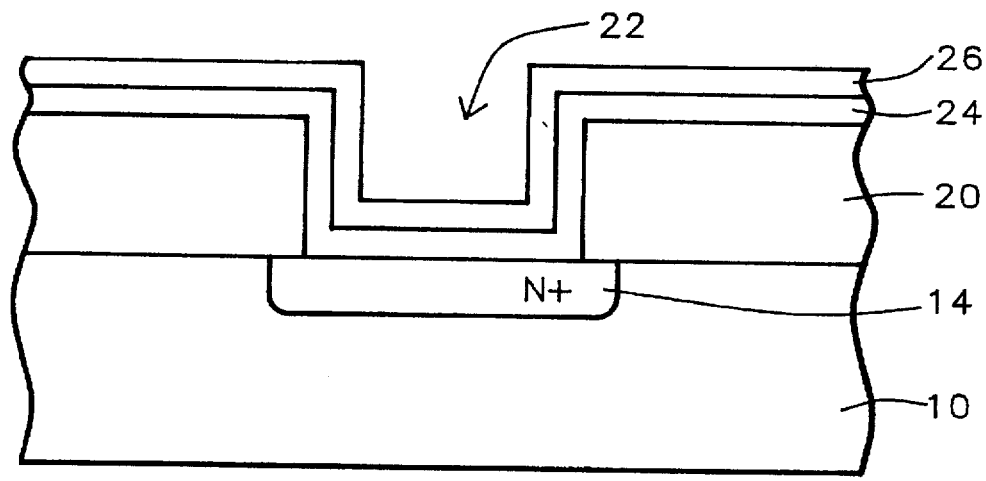

Referring now to FIG. 5, a glue layer is deposited conformally over the surface of the insulating layer 20 and within the contact hole 22. The glue layer preferably is composed of titanium 24 and is deposited by chemical vapor deposition (CVD) or physical vapor deposition (PVD) to a thickness of between about 500 to 1000 Angstroms. A titanium nitride barrier layer 26 is deposited conformally over the glue layer 24 by CVD or PVD to a thickness of between about 500 to 1500 Angstroms.

Alternatively, a thick layer of titanium could be deposited over the insulating layer 20. The titanium layer is nitrided to form a titanium nitride layer within the top portion of the titanium layer, resulting in titanium layer 24 and titanium nitride layer 26, as shown in FIG. 5.

Volcano defects are believed to result from stress-induced deformation of the TiN barrier layer, as described hereinabove. All reliable thermal treatments to enhance the integrity of the TiN film change the film stress from compressive to tensile. As discussed above, thermal treatment is undesirable because of low throughput. The key feature of the present invention is the introduction of a stress buffer layer having tensile stress which effectively stops the volcano defects.

Figure 6:
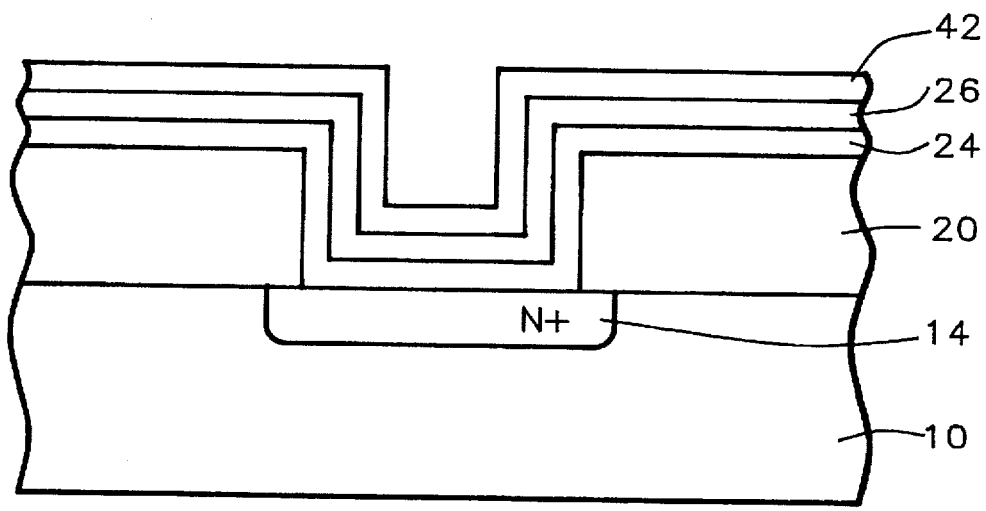

Referring now to FIG. 6, a cap stress buffer layer 42 having low resistance is deposited conformally over the surface of the barrier layer 26. The stress buffer layer 42 may be composed of tungsten silicide or any other dielectric material such as titanium silicide, cobalt silicide, or the like, and is deposited by CVD to a thickness of between about 500 to 1500 Angstroms. This stress buffer layer 42 provides enough protection of the underlying Ti/TiN barrier layer to prevent volcano defects. This has been proven experimentally.

Figure 7:
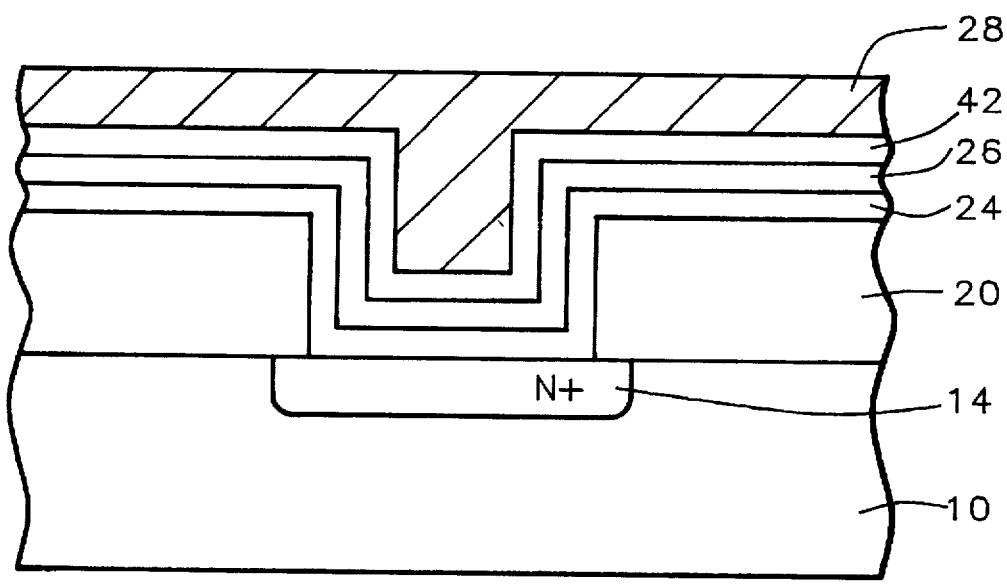

Referring now to FIG. 7, tungsten 28 is blanket deposited over the surface of the substrate using $WF_6$ as a precursor in a chemical vapor deposition chamber.

Figure 8:
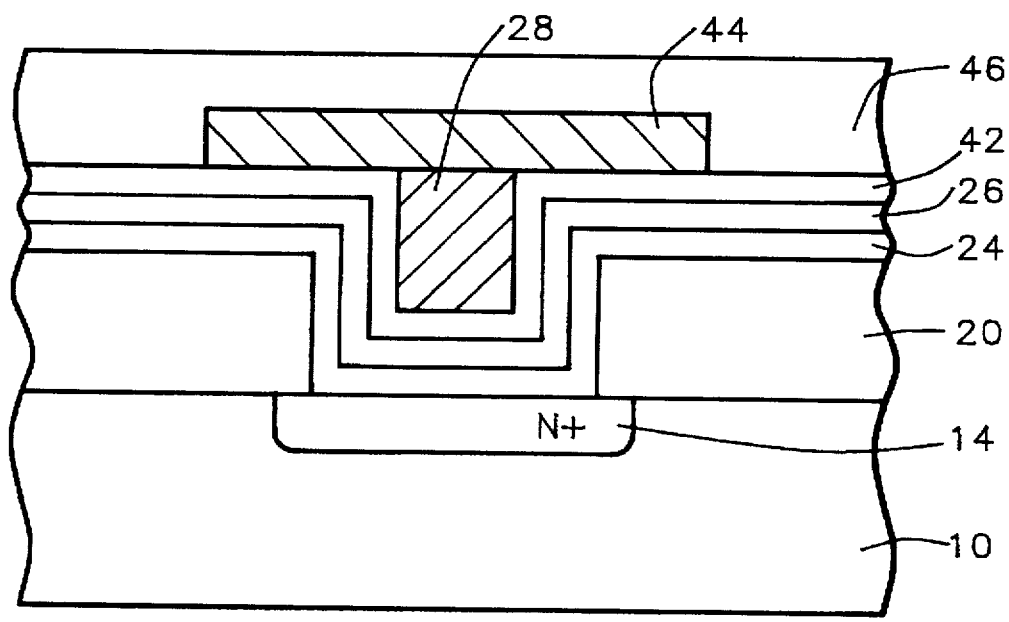

Referring now to FIG. 8, the tungsten is etched back to form the tungsten plug 28 within the contact hole. The second metallization 44, such as an aluminum alloy, is deposited and patterned. A passivation layer 46 completes fabrication of the integrated circuit. Of course, other processes may be performed such as an intermetal dielectric deposition and further metallization, as is well known in the art.

EXAMPLE

The following Example is given to show the important features of the invention and to aid in the understanding thereof. Variations may be made by one skilled in the art without departing from the spirit and scope of the invention.

Figure 9:
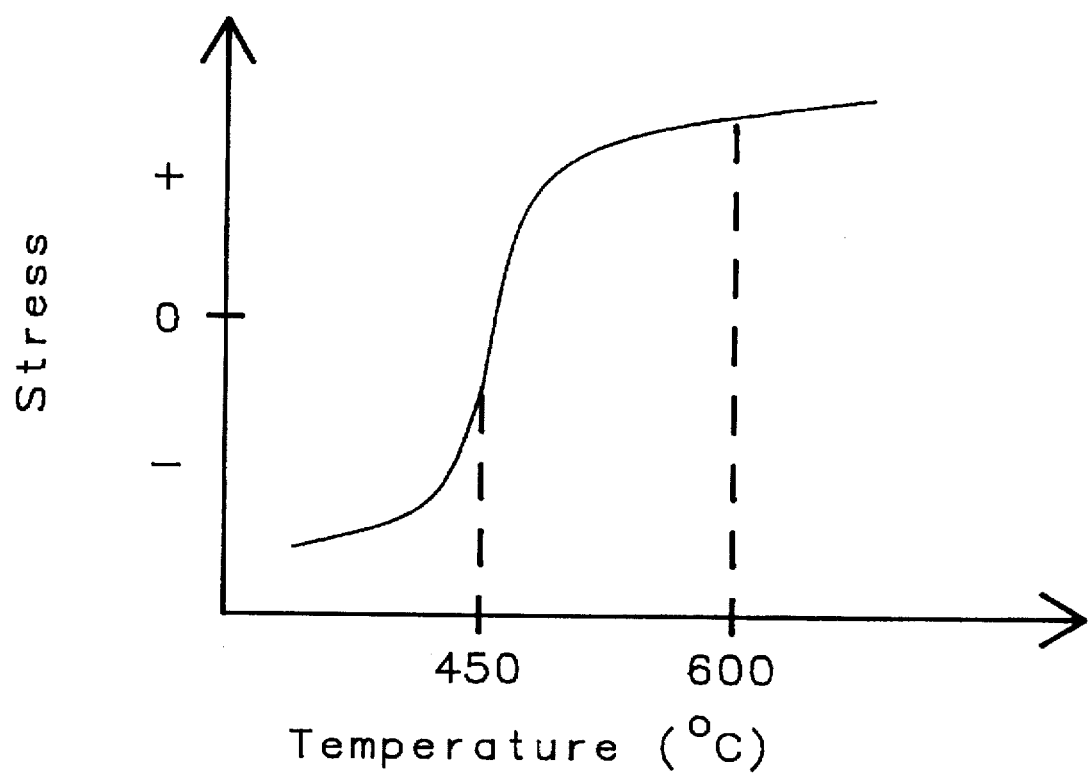
FIG. 9 graphically illustrates stress as a function of temperature.

FIG. 9 graphically illustrates stress as a function of temperature. "+" represents tensile stress and "−" represents compressive stress (as deposited) in FIG. 9 and in Table 1.

In an experiment, the inventors conformally deposited 400 Angstroms of titanium within a contact hole followed by 1000 Angstroms of titanium nitride. Stress was measured in $dynes/cm^2$ for each wafer after the Ti/TiN layer was deposited. This is shown in the second column of Table 1. Four methods of preparing the barrier layer for tungsten deposition were performed, two trials for each method. The first method was a RTA at 640° C. for 1 minute. The second method was a $WSi_x$ stress buffer layer of the present invention having a thickness of 500 Angstroms. The third method was furnace annealing at 450° C. and the fourth method was a furnace annealing at 660° C. The stress of the barrier layer was measured after each method was complete. Observations to detect volcano defects were made after the tungsten deposition. The results are shown in the following table.

TABLE 1

| run | Ti/TiN depos. | stress RTA | $(dynes/cm^2)$ Invention | after Furnace (450° C.) | Furnace (660° C.) | Volcano Defects |
|---|---|---|---|---|---|---|
| 1 | −4.272E9 | +1.587E10 | | | | — |
| 2 | −4.514E9 | +1.548E10 | | | | — |
| 3 | −4.045E9 | | +6.745E9 | | | — |
| 4 | −4.731E9 | | +6.679E9 | | | — |
| 5 | −4.338E9 | | | +3.6E9 | | — |
| 6 | −4.603E9 | | | −2.145E9 | | −15% |
| 7 | −4.129E9 | | | | +1.422E10 | — |
| 8 | −4.338E9 | | | | +1.387E10 | — |

It can be seen from Table 1 that the process of the present invention as well as the RTA and high temperature furnace annealing processes result in the absence of volcano defects. The low temperature furnace annealing process shows non-uniformity, as evidenced by the large difference in measured stress between the two runs, and also shows the presence of volcano defects.

Although the RTA and high temperature furnace annealing processes result in the prevention of volcano defects, it is desirable to keep the thermal budget as low as possible. The process of the present invention prevents volcano defects and does not increase the thermal budget.

While the invention has been particularly shown and described with reference to the preferred embodiments thereof, it will be understood by those skilled in the art that various changes in form and details may be made without departing from the spirit and scope of the invention.

What is claimed is:

1. A method of forming tungsten plug metallization without volcano defects in the fabrication of integrated circuits comprising:

providing semiconductor device structures in and on a semiconductor substrate;

providing an insulating layer covering said semiconductor device structures wherein a contact opening is made through said insulating layer to said semiconductor substrate;

depositing a barrier layer conformally over the surface of said insulating layer and within said contact opening;

depositing a stress buffer layer comprising one of the group containing titanium silicide, and cobalt silicide and having a thickness of between about 500 and 1500 Angstroms overlying said barrier layer wherein said stress buffer layer prevents volcano defects; and forming a tungsten plug within said contact opening to complete said formation of said tungsten plug metallization without volcano defects in said fabrication of said integrated circuit.

2. The method according to claim 1 wherein said barrier layer is composed of a first layer of titanium having a thickness of between about 500 and 1000 Angstroms and a second layer of titanium nitride having a thickness of between about 500 and 1500 Angstroms.

3. The method according to claim 1 wherein said tungsten plug is deposited using $WF_6$ gas as a precursor and wherein the presence of said stress buffer layer prevents the formation of stress cracks in said underlying barrier layer and wherein the prevention of said stress cracks prevents the penetration of said $WF_6$ gas into said barrier layer and wherein said prevention of said penetration of said $WF_6$ gas prevents the formation of said volcano defects.

4. A method of forming tungsten plug metallization without volcano defects in the fabrication of integrated circuits comprising:

providing semiconductor device structures in and on a semiconductor substrate;

providing an insulating layer covering said semiconductor device structures wherein a contact opening is made through said insulating layer to said semiconductor substrate;

depositing a glue layer conformally over the surface of said insulating layer and within said contact opening;

depositing a barrier layer conformally over said glue layer;

depositing a stress buffer layer comprising one of the group containing titanium silicide and cobalt silicide and having a thickness of between about 500 and 1500 Angstroms overlying said barrier layer wherein said stress buffer layer prevents volcano defects; and forming a tungsten plug within said contact opening to complete said formation of said tungsten plug metallization without volcano defects in said fabrication of said integrated circuit.

5. The method according to claim 4 wherein said glue layer is composed of titanium having a thickness of between about 500 and 1000 Angstroms.

6. The method according to claim 4 wherein said barrier layer is composed of titanium nitride having a thickness of between about 500 and 1500 Angstroms.

7. The method according to claim 4 wherein said tungsten plug is deposited using $WF_6$ gas as a precursor and wherein the presence of said stress buffer layer prevents the formation of stress cracks in said underlying barrier layer and wherein the prevention of said stress cracks prevents the penetration of said $WF_6$ gas through said barrier layer to said glue layer and wherein said prevention of said penetration of said $WF_6$ gas prevents the formation of said volcano defects.

8. A method of forming tungsten plug metallization without volcano defects in the fabrication of integrated circuits comprising:

providing semiconductor device structures in and on a semiconductor substrate;

providing an insulating layer covering said semiconductor device structures wherein a contact opening is made through said insulating layer to said semiconductor substrate;

depositing a titanium layer conformally over the surface of said insulating layer and within said contact opening;

forming a titanium nitride layer overlying said titanium layer;

depositing a stress buffer layer comprising one of the group containing tungsten silicide, and cobalt silicide and having a thickness of between about 500 and 1500 Angstroms overlying said titanium nitride layer wherein said stress buffer layer prevents the formation of stress cracks in said titanium nitride layer; and forming a tungsten plug within said contact opening using $WF_6$ gas as a precursor wherein said prevention of said stress cracks prevents the penetration of said $WF_6$ gas through said titanium nitride layer to said titanium layer and wherein said prevention of said penetration of said $WF_6$ gas prevents the formation of said volcano defects to complete said formation of said tungsten plug metallization without volcano defects in said fabrication of said integrated circuit.

9. The method according to claim 8 wherein said titanium layer has a thickness of between about 500 and 1000 Angstroms.

10. The method according to claim 8 wherein said titanium nitride layer has a thickness of between about 500 and 1500 Angstroms.

* * * * *